United States Patent [19]
Kwon et al.

[11] Patent Number: 5,773,353
[45] Date of Patent: Jun. 30, 1998

[54] METHOD OF FABRICATING A SEMICONDUCTOR SUBSTRATE

[75] Inventors: Oh-Joon Kwon, Daejeon; Jung-Hee Lee; Yong-Hyun Lee, both of Taegu, all of Rep. of Korea

[73] Assignee: Electronics and Telecommunications Research Institute, Daejeon, Japan

[21] Appl. No.: 564,505

[22] Filed: Nov. 29, 1995

[30] Foreign Application Priority Data

Dec. 15, 1994 [KR] Rep. of Korea ............... 94 34390

[51] Int. Cl.⁶ .................................. H01L 21/76
[52] U.S. Cl. ..................... 438/426; 438/441; 438/466; 438/960
[58] Field of Search ............... 437/62, 67, 170; 148/DIG. 117; 438/426, 441, 466, 222, 227, 229, 330, 960

[56] References Cited

U.S. PATENT DOCUMENTS

| | | |
|---|---|---|
| 4,810,667 | 3/1989 | Zorinsky et al. . |
| 5,023,200 | 6/1991 | Blewer et al. . |
| 5,063,117 | 11/1991 | Suda et al. . |
| 5,166,639 | 11/1992 | Green et al. ............ 330/294 |

FOREIGN PATENT DOCUMENTS

| | | |
|---|---|---|
| 2050359 | 4/1992 | Canada . |
| 307850 | 2/1989 | European Pat. Off. . |
| 0501279 | 9/1992 | European Pat. Off. . |
| 051279 | 9/1992 | European Pat. Off. . |
| 544387 | 6/1993 | European Pat. Off. . |
| 266452 | 3/1992 | France . |
| 3886319 | 1/1994 | Germany . |
| 5021705A | 1/1993 | Japan . |
| 5022705A | 1/1993 | Japan . |
| 2248346 | 4/1992 | United Kingdom . |

OTHER PUBLICATIONS

Teng, An Investigation of the Application of Pourous Silicon Layers to the Dielectric Isolation of Integrated Circuits;J. Electrochem. Soc., Solid State Science and Technology; (May, 1979) pp. 870–874.

Zorinsky, E.J.; The "Islands" Method–A Manufacturable Porous Silicon SOI Technology; 1986 IEEE; pp. 431–434.

(List continued on next page.)

*Primary Examiner*—George R. Fourson
*Attorney, Agent, or Firm*—Jacobson, Price, Holman & Stern, PLLC

[57] ABSTRACT

A semiconductor substrate and a method of fabricating the same, and provides which the active area to be formed the active element is defined by the trench filled with any conductive polycrystal silicon in which any portion of a large number of the epitaxial layer is crystally grown on any conductive silicon substrate, and the multi-aperture silicon oxide layer is formed from the metal line to be used to the passive element or the transmitting line outside the trench, so that the interference between the passive element and the semiconductor substrate is prevented, and to attenuate the transmitting signal prevents to be attenuated in the high frequency band operation. Therefore, the semiconductor substrate for a unit active element and the MMIC to be able to operate the high frequency band is manufactured into the silicon, and thus it is advantageous to reduce the cost and enhance the yield. Silicon oxide layer is formed from the metal line to be used to the passive element or the transmitting line outside the trench, so that the interference between the passive element and the semiconductor substrate is prevented, and to attenuate the transmitting signal prevents to be attenuated in the high frequency band operation. Therefore, the semiconductor substrate for a unit active element and the MMIC to be able to operate the high frequency band is manufactured into the silicon, and thus it is advantageous to reduce the cost and enhance the yield.

9 Claims, 3 Drawing Sheets

OTHER PUBLICATIONS

Tsao, S., "Porous Silicon Techniques for SOI Structures", *IEEE Circuits & Devices Magazine*, Nov./1987, pp. 3–7, vol. 3, No. 6.

Frye, R. C.; The formation of Porous Silicon and its Applications to Dielectric Isolation; Elsevier Science Publishing Co.; pp. 53–58 (date unknown).

Imai et al; FIPOS (Full Isolation by Porous Oxidized Silicon) Technology and Its Application to LSI's.; IEEE Transactions on Electron Devices. Vol. ED–31, No. 3, March 1984; pp. 297–302.

Imai, et al; Crystaline Quality of Silicon Layer Formed by FIPOS Technology; Journal of Crystal Growth 63 (1983) pp. 547–553.

Unagami, et al.: "Study of the Injection Type IPOS Scheme"; pp. 1635–1640; Japanese Journal of Applied Phys., vol. 16, No. 9.S (1977).

Anzai, et al.: "Fabrication of High Speed 1 Micron FIPOS/ CMOS"; pp. 796–799; IEDM 84 (1984).

Frye, R.C.: "The Formation of Porous Silicon and Its Applications to . . . "; pp. 53–62; Mat. Het. Soc. Symp. Proc. vol. 33 (1984).

METHOD OF FABRICATING A SEMICONDUCTOR SUBSTRATE

BACKGROUND OF THE INVENTION

1. Field of Invention

The present invention relates to a semiconductor substrate for the high frequency band and a method of fabricating the same, and more particularly, the present invention relates to a semiconductor and a method for fabricating the elements for high frequency band operation using silicon.

2. Description of Related Art

Monolithic microwave integrated circuits (MMIC) or hybrid microwave integrated circuits (HMIC) are generally formed by a unit of active elements. These include a heterojunction bipolar transistor (HBT) as the semiconductor element for operation in the high frequency band, a metal semiconductor field effect transistor (MESFET) or a high electron mobility transistor (HEMT), etc., and passive elements that include a unit of an active element and an inductor.

The elements are formed over a semi-insulating substrate of a composition semiconductor, such as gallium arsenic (GaAs), in which the transmitting signal is attenuated by interference between the semiconductor substrate and the metal line to be used in the passive element, such as the inductor etc., or the transmitting line in the high frequency band operation of approximately 800 MHz −10 GHz if the electrical conductivity is large as where the impurity concentration of the semiconductor substrate is high together with those of the silicon substrate.

Therefore, a semi-insulating substrate of a composition semiconductor which causes relatively small attenuation of the transmitting signal is used, since the semiconductor substrate, rather than the silicon substrate, may be easily fabricated as the semiconductor substrate to form the elements operating in the high frequency band.

When a unit of active elements, i.e. MMIC or HMIC, is fabricated by using a semi-insulating substrate of a composition semiconductor, the multi-layers are formed by epitaxial growing techniques over top the semi-insulating substrate.

The active area of forming the active elements and the non-active area of forming the passive elements are defined by mesa-etching any portion of the epitaxial layer and exposing the semi-insulating substrate or by ion-implanting the impurity if the semi-insulating substrate is not exposed.

As noted above, while operating in the high frequency band, the semi-insulating substrate prevents attenuation of the transmitting signal because there is a low electrical conductivity and no interference between the passive element, such as the inductor etc., formed on the exposed non-active area and the metal line which is used as the transmitting line.

However, a semi-insulating substrate of a composition semiconductor that prevent attenuation of a transmitting signal during high frequency band operation has a relatively higher cost and problems during fabrication that results in a lower yield as compared to a silicon substrate.

SUMMARY OF THE INVENTION

Therefore, it is an object of the present invention to provide a semiconductor substrate which prevents attenuation of the transmitting signal, with a lower cost and higher yield during fabrication of the elements.

It is another object of the present invention to provide a method for fabricating a semiconductor substrate where the silicon substrate will not attenuate the transmitting signal.

The semiconductor substrate according to the present invention comprises a multi-aperture silicon oxide substrate; a large number of any conductive epitaxial layers including the high concentration and low concentration to be formed the low concentration layer and the active element in which the positive reaction prevents to generate on the multi-aperture silicon oxide substrate; a trench defining an active area formed by any deep to be the lower bottom of the silicon substrate at any portion of the epitaxial layers, and filled in the inner of the trench into the silicon oxide; and a multi-aperture silicon oxide layer formed on the epitaxial layers except for the regions of the trench and the active area.

A method for fabricating the semiconductor substrate according to the present invention comprises the step of growing a large number of epitaxial layers into any thickness, respectively, including the second conductive of the high and low concentration epitaxial layers to be formed the second conductive of the low concentration epitaxial layer and the active element in which the positive reaction prevents to generate on the first conductive of the silicon substrate, the step of laminating a first protective film on the upper epitaxial layer, the step of forming the trench defining an active area by exposing any portion of the first protective film and etching at a depth so that the silicon substrate is exposed, leaving the epitaxial layer to use the first protected film as a mask, the step of filling the inner of the trench with silicon oxide, the step of removing the first protective film, except for at the active area, which may include any thickness of the upper epitaxial layer there underneath, the step of forming a second protective film to cover any portion of the exposed epitaxial layer on top of the first protective film including the silicon oxide of the inner of the trench, the step of doping the epitaxial layers of the outside portion of the semiconductor substrate and the active area with a first conductive impurity, the step of forming a multi-aperture layer by flowing out the doped impurity at the outside portion of the semiconductor substrate and the active area, and the step of forming a multi-aperture silicon oxide layer by oxidizing the multi-aperture silicon and removing the second protective layer and the first protective layer.

BRIEF DESCRIPTION OF THE DRAWINGS

Further features and advantages will become more apparent from the following and a more particular description of the preferred embodiment of the present invention, as illustrated in the accompanying drawings, and in which.

DETAILED DESCRIPTION OF THE INVENTION

Figure 1:
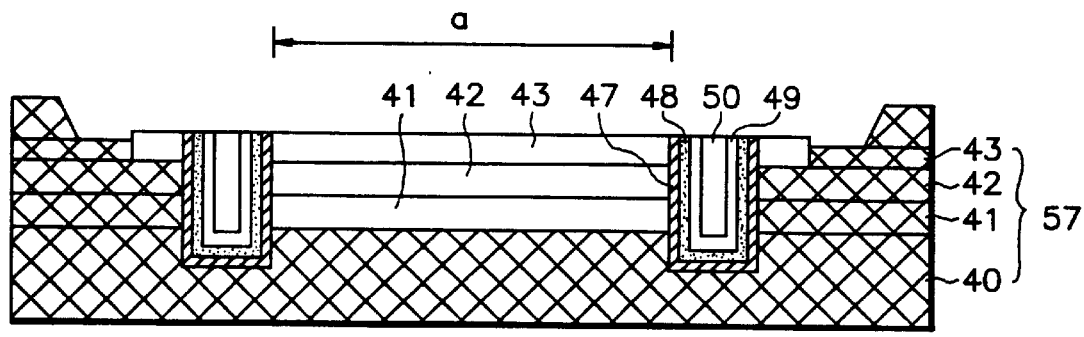
FIG. 1 is a sectional view of the semiconductor substrate according to the present invention.

FIG. 1 is a sectional view of the semiconductor substrate according to an embodiment of the present invention.

The semiconductor substrate may form a unit element of HBT and the MMIC including thereof.

The semiconductor substrate is sequentially formed on top of a oxidized multi-aperture silicon substrate 40 with an N−-type for the first epitaxial layer 41, an N+-type for the second epitaxial layer 42, and an N−-type for the third epitaxial layer 43, and a trench defining an active area a of the element with an depth to operate the silicon substrate as the lower surface is formed at any portion of the first, the second and the third epitaxial layers 41, 42 and 43.

As mentioned hereinabove, the portion including the trench, but excluding the active area a, is the non-active area.

The silicon oxide film 47, the silicon nitride film 48 and the silicon oxide film 49 are formed on the sides of the trench 46, and the silicon oxide 48 formed by a chemical vapor deposition (CVD) method is filled in the inside thereof.

As noted above, the portions of the first, the second and the third epitaxial layers 41, 42 and 43 outside of the trench defining the silicon substrate 40 and the active area a present the multi-aperture silicon oxide.

Therefore, the first, the second and the third epitaxial layer within the active area a are in floating condition, and thus electrically isolated by the neighboring active area a.

As noted above, the silicon substrate 40 has a non-resistance of about 5000 Ω·cm to be made a multi-aperture by flowing out the impurity doped by the positive reaction.

The epitaxial layer 41 is formed with a thickness of about 4–6 μm by doping the N-type of the impurity, such as the arsenic (AS) or the phosphorous (P) etc., with a low concentration of about $5\times10^{13}$–$5\times10^{14}$/Cm$^3$.

The second epitaxial layer 42 is used for the buried layer of the HBT, and is formed with a thickness of about 1.5–2.5 μm by doping the N-type of the impurity, such as the arsenic (AS) or the phosphorus (P) etc., with a high concentration of about $1\times10^{19}$–$5\times10^{19}$/Cm$^3$, and the third epitaxial layer 43 is used as the collector area, and is formed with a thickness of about 2–4 μm by doping the N-type of the impurity, such as the arsenic (AS) or the phosphorus (P) etc., with a concentration of about $5\times10^{14}$–$5\times10^{15}$/Cm$^3$.

The silicon substrate 40 is multi-aperture oxidized together with the portions of the first, the second and the third epitaxial layers 41, 42 and 43 outside of the active area a, thereby isolating the active area a in the form of an island.

As mentioned hereinabove, the first epitaxial layer 41 within the active area a does not easily flow out the impurity from the positive reaction since the doping concentration of the impurity is lower and is thereby not being made multi-aperture, and the impurity of the second and the third epitaxial layers 42 and 43 within the active area a prevent to flow out and oxidize.

The trench has a depth of about 10–16 μm so that the bottom of the silicon substrate 40 is formed at any portion of the first, the second and the third epitaxial layers 41, 42 and 43, and defines the active area a of the elements.

The trench 46 also damps the stress generated from expanding the volume while forming the multi-aperture silicon oxide 57.

The silicon oxide layers 47 and 49, and the silicon nitride film 48 are sequentially formed on the surface of the trench, and the silicon oxide 50 is filled into the inside of the trench 46.

The silicon oxide 40 prevents to be corrosion by the electrolytic liquid, in which the silicon oxide films 47 and 49, and the silicon nitride film 48 are filled the silicon oxide 40 into the trench 46.

As noted above, the multi-aperture silicon oxide 57 formed at the non-active area has a high resistance value, so that the metal line used for the passive element, such as the inductor, is formed thereon, and no transmitting line interferences the silicon substrate 40, thereby preventing attenuation of the transmitting signal in the high frequency band operation.

While the embodiment according to the present invention as described hereinabove illustrates the semiconductor substrate which can form the unit element of an HBT and the MMIC including thereof, it should be noted that the present invention may be applied to a semiconductor substrate that can form a unit element such as with MESFET or HEMT and the MMIC including thereof.

FIGS. 2(A)–(G) illustrate the process of the method for fabricating the semiconductor substrate according to the embodiment of the present invention.

Figure 2A:
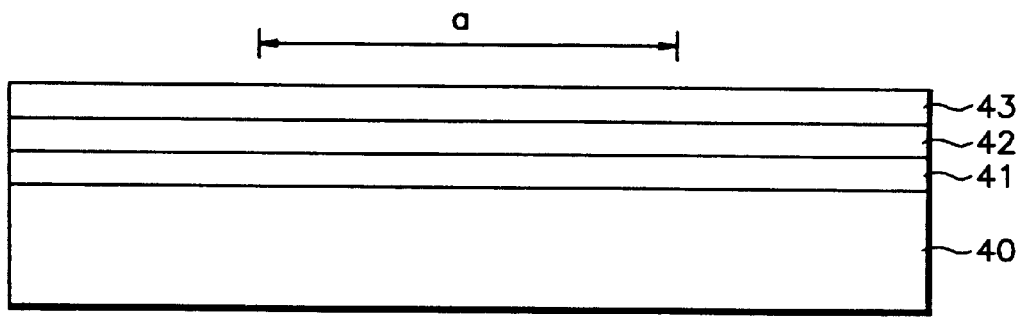
FIGS. 2(A)–(G) illustrate the process of fabricating the semiconductor substrate according to the present invention.

Referring to FIG. 2(A), there is shown a P-type silicon substrate 41 with a (100) orientation which has the non-resistance of about 10–20 Ω·Cm by doping the P-type impurity, such as boron, with a concentration of about $1\times10^{14}$–$1\times10^{15}$/Cm$^3$.

The silicon oxide film (not shown) with a thickness of about 300–500 Angstrom defining the active area is formed at any portion of the top side of the silicon substrate 40. The impurity area (not shown) forms to activate after the P-type impurity, such as the born of the zinc, is ion injected into an energy of about 100–150 KeV and the dose of about $1\times10^{16}$–$5\times10^{16}$/Cm$^2$ at the area except for the active area a using the silicon oxide film as a mask.

The first epitaxial layer 41 with a thickness of about 4–6 μm doped with the N-type of the impurity, such as the arsenic or the phosphorous etc., with a concentration of about $5\times10^{13}5\times10^{14}$/Cm$^3$ on the surface of the silicon substrate 40; the second epitaxial layer 42 with a thickness of about 1.5–2.5 μm doped with the N-type of the impurity with a high concentration of about $1\times10^{19}$–$5\times10^{19}$/Cm$^3$, and the third epitaxial layer 43 with a thickness of about 3–4 μm doped with the N-type of the impurity with the concentration of about $5\times10^{14}$–$5\times10^{15}$/Cm$^3$ are sequentially formed by liquid phase epitaxy or metal organic chemical vapor deposition methods.

As mentioned hereinabove, the epitaxial layer 41 within the active area a prevents flowing out and oxidizing of the impurity of the second and the third epitaxial layers 42 and 43 which is used to the buried layer of the HBT and the collector area within the active area a in oxidizing after the next positive reaction.

The first, the second and the third epitaxial layers 41, 42 and 43, excluding the active area a, are also P-type conductive by diffusing the impurity of the impurity area.

Figure 2B:
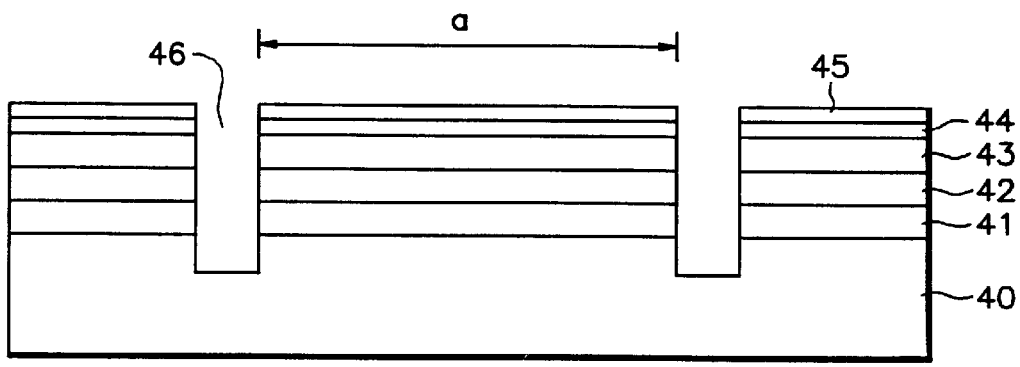

Referring to FIG. 2(B), the protective film is formed by sequentially growing the silicon oxide film 44 with a thickness of about 300–500 Angstrom and the silicon nitride film 45 with a thickness of about 1000–1500 Angstrom on the upper of the third epitaxial layer 43.

The epitaxial layer 43 is also exposed by removing the silicon nitride film 44 and the silicon oxide film 45 between the active area a and the impurity area by the commonly used photo lithography method.

The trench 46 is then formed by etching the first, the second and the third epitaxial layers 41, 42 and 43 up to a depth of about 10–15 μm so that the silicon substrate 40 is exposed and using the silicon oxide film 44 and the silicon nitride film 45 as a mask.

Figure 2C:
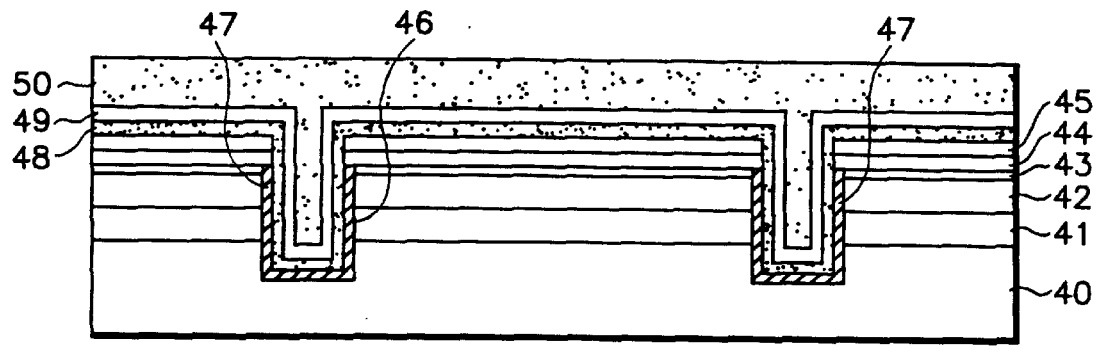

Referring to FIG. 2(C), the inner surface of the trench 46 is cleaned by submerging and wet etching with a diluted HF solvent after the trench oxidizes at the temperature of about 1000 degrees centigrade for approximately one hour using a dry O$_2$.

The silicon oxide film 47 with a thickness of about 700–1200 Angstrom, the silicon nitride film 48 with a thickness of about 1000–3000 Angstrom, and the silicon oxide film 49 with a thickness of about 1500–2500 Angstrom are then formed on the inner surface of the trench 46, sequentially.

As noted above, the silicon oxide film 47 is formed by thermally oxidizing the side of the first, the second and the third epitaxial layers 41, 42 and 43, and the exposed portion of the silicon substrate 40, and the silicon nitride film 48 is laminated and formed by a chemical vapor deposition method.

The silicon oxide 50 is filled in the inside of the trench 46 by a chemical vapor deposition method or a spin-on-glass (SOG) method. The silicon oxide 50 is then formed on top of the portions of the silicon nitride film 49 outside of the trench 47.

Figure 2D:
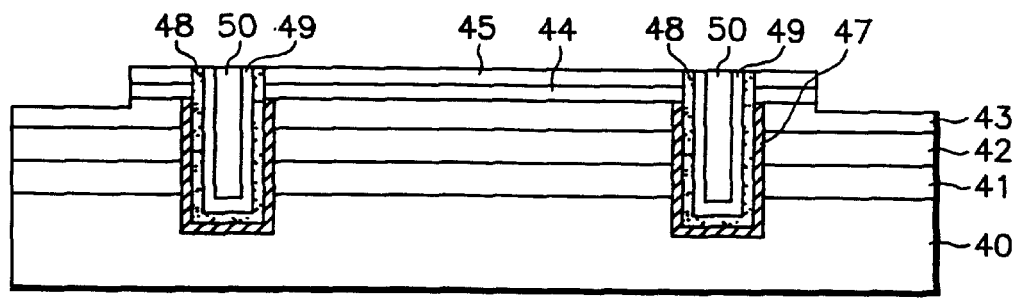

Referring to FIG. 2(D), the silicon oxide 50, the silicon nitride film 49, and the silicon oxide films 48 and 47 are removed by chemical mechanical polishing (CMP) using the silicon nitride film as the etching stopper layer.

The silicon nitride film 45, and the silicon oxide film 44, except for within the active area a, are serially removed by the common photolithography method.

Then, the third epitaxial layer 45 is also etched with a depth of about 1.5–2.5 $\mu$m, thereby damping the stress generated by the volume expansion from the multi-aperture silicon oxide layer to be formed next.

Figure 2E:
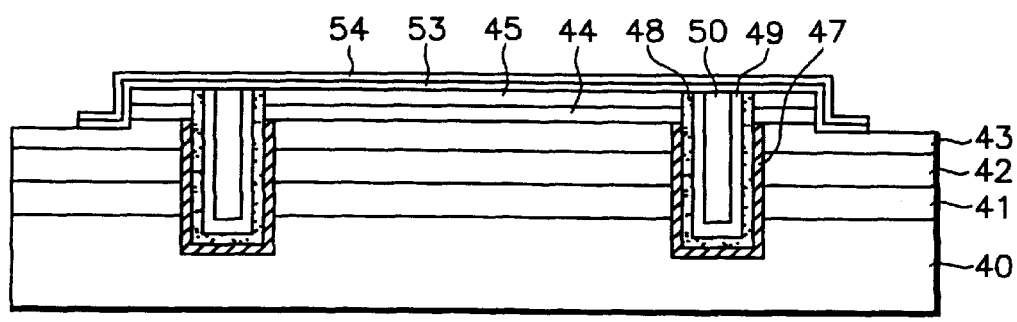

Referring to FIG. 2(E), the full surface of the structure, as discussed above, is laminated by the silicon oxide 53 having a thickness of about 1000–2000 Angstrom and the silicon nitride film 54 having a thickness of about 3000–4000 Angstrom, respectively.

Any portion of the silicon nitride film 54 and the silicon oxide film 53 outside of the active area defined by the trench is pattered by the common photolithography method, exposing the third epitaxial layer 43.

Figure 2F:
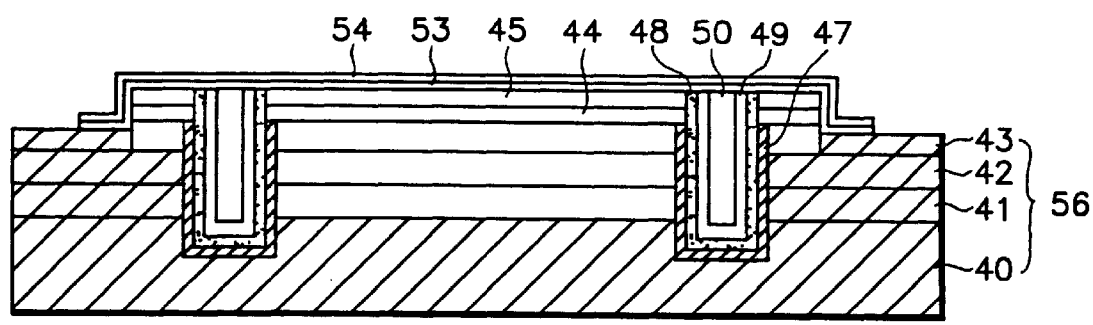

Referring to FIG. 2(F), the natural oxide film (not shown) of the under surface of the silicon substrate 40 is removed.

Then, the P-type of the impurity concentration of the first, the second and the third epitaxial layer 41, 42 and 43, of all the silicon substrate 40, and the portions outside of the active area a is raised higher by reactions after the P-type of the impurity, such as the boron (B) etc., is ion injected by an energy of about 120–200 KeV and the dose of about $1\times10^{15}$–$1\times10^{16}$/Cm$^3$ at the under portion of the silicon substrate 40, and at the exposed portion of the epitaxial layer 43 to reduce the etching solvent and the contacting resistance when the silicon substrate 40 and the first, the second and the third epitaxial layers 41, 42 and 43 are multi-apertured.

The silicon substrate 40 submerges in an HF solvent, and the positive reaction is performed at a current concentration of about 20–80 mA/Cm$^2$.

Therefore, the doped P-type impurity flows out of the first, the second and the third epitaxial layers 41, 42 and 43, except for the portions in active area a, and of the silicon substrate 40, and thereby the multi-aperture layer 56 is formed.

Then, if the impurity does not flow out of the first epitaxial layer 41 within the active area, the impurity is prevented from flowing out of the first, the second and the third epitaxial layers 42 and 43.

Figure 2G:
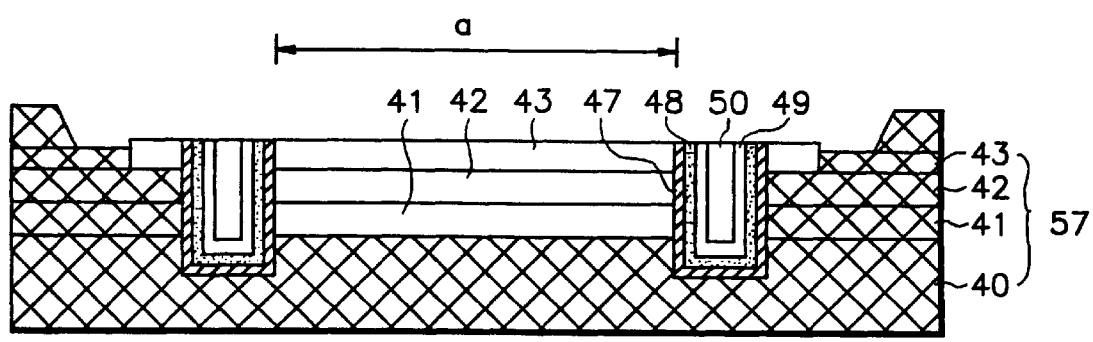

Referring to FIG. 2(G), the multi-aperture silicon oxide layer 57 is formed by oxidizing the multi-aperture layer 56.

As mentioned hereinabove, the multi-aperture layer 56 is wider than the surface area of the flowed portion, thereby speedily oxidizing it.

Also, the multi-aperture silicon oxide layer 56 formed in the oxidizing described above generates stresses by the expansion of its volume, and thus this stress is damped by the trench 46.

Last, the semiconductor substrate is completed by removing the silicon oxide films 54 and 45, and the silicon oxide 53 and 44.

As mentioned hereinabove, the present invention provides the active area to be formed the an active element defined by the trench filled with any conductive polycrystal silicon in which any portion of a large number of epitaxial layers is crystally grown on any type of conductive silicon substrate, and the multi-aperture silicon oxide layer with a thickness of about 30–50 $\mu$m is formed from a metal line to be used to the passive element or the transmitting line outside the trench, so that the interference between the passive element and the semiconductor substrate is prevented, and the transmitting signal is prevented from attenuation in the high frequency band operation.

Therefore, the semiconductor substrate for a unit active element and the MMIC is manufactured into the silicon to be able to operate the high frequency band, and thus it advantageously reduces the cost and enhances the yield.

While the foregoing discloses the preferred embodiment of the invention it is to be understood that many changes in the detail may be made as a matter of engineering choices without departing from the spirit and scope of the invention as defined by the appended claims. Moreover, those skilled in the art may find that it is not necessary to adopt all of the various advantages and features of the present disclosure into other semiconductor substrates in order to realize the individual advantages disclosed herein.

What is claimed is:

1. A method of fabricating a semiconductor substrate, comprising the steps of:

providing a first conductivity type semiconductor substrate;

growing a plurality of epitaxial layers of the second conductivity type on the substrate including a top epitaxial layer, at least one of the layers having a higher conductivity than another of the layers;

forming a patterned first protection film on the top epitaxial layer;

forming a trench using the patterned protection film as a mask, wherein the trench defines an active area and an inactive area;

filing the trench with silicon oxide;

further patterning the patterned first protection film by removing part of the patterned first protection film from the inactive area;

using the further patterned first protection film as a mask to remove a portion of the thickness of the top epitaxial layer;

forming a second patterned protection film on the further patterned first protection film and on a portion of the resulting thickness of the top epitaxial layer;

forming doped regions by doping the substrate, the resulting exposed remaining portion of the top epitaxial layer and the plurality of epitaxial layers using the second patterned protection film as a mask;

anodizing the doped regions to convert the doped regions to porous silicon;

oxidizing the porous silicon; and removing the further patterned first protection film and the second patterned protection film.

2. The method of claim 1, further comprising the step of ion injecting the first conductivity type impurity with an energy of 100–150 KeV and a dose of $1\times10^{15}$–$1\times10^{16}$/Cm$^2$ at the inactive area.

3. The method of claim 1, wherein said first and second protection films are dual films of a silicon oxide film and a silicon nitride film.

4. The method of claim 1, further comprising the step of forming the silicon oxide film and the silicon nitride film in the inner surface of the trench.

5. The method of claim 1, wherein said upper epitaxial layer is etched by a depth of 1.5–2.5 $\mu$m to remove said first protection film.

6. A method of fabricating a semiconductor substrate, comprising the steps of:

provending a first conductivity type semiconductor substrate;

growing a plurality of epitaxial layers of the second conductivity type on the substrate including a top epitaxial layer, at least one of the layers having a higher conductivity than another of the layers;

forming a patterned first protection film on the top epitaxial layer;

forming a trench using the patterned protection film as a mask, wherein the trench defines an active area and an inactive area;

forming a silicon dioxide film and a silicon nitride film onto the inner surface of the trench and doping the films;

filing the trench with silicon oxide;

further patterning the patterned first protection film by removing part of the patterned first protection film from the inactive area;

using the further patterned first protection film as a mask to remove a portion of the thickness of the top epitaxial layer;

forming a second patterned protection film on the further patterned first protection film and on a portion of the resulting thickness of the top epitaxial layer;

forming doped regions by doping the substrate, the resulting exposed remaining portion of the top epitaxial layer and the plurality of epitaxial layers using the second patterned protection film as a mask;

anodizing the doped regions to convert the doped regions to porous silicon;

oxidizing the porous silicon; and removing the further patterned first protection film and the second patterned protection film.

7. The method of claim 6, further comprising the step of ion injecting the first conductivity type impurity with an energy of 100–150 KeV and a dose of $1\times10^{15}$–$1\times10^{16}$/Cm$^2$ at the inactive area.

8. The method of claim 6, wherein said first and second protection films are dual films of a silicon oxide film and a silicon nitride film.

9. The method of claim 6, wherein said upper epitaxial layer is etched by a depth of 1.5–2.5 $\mu$m to remove said first protection film.

* * * * *